United States Patent
Feng et al.

(10) Patent No.: US 11,736,179 B2
(45) Date of Patent: Aug. 22, 2023

(54) METHOD AND APPARATUS FOR MULTI-ANTENNA COMMUNICATION

(71) Applicant: Telefonaktiebolaget LM Ericsson (publ), Stockholm (SE)

(72) Inventors: Ang Feng, Stockholm (SE); Zhicai Ma, Beijing (CN); Liushuan Zhou, Beijing (CN); Yanhui Zhao, Sollentuna (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 17/786,604

(22) PCT Filed: Dec. 20, 2019

(86) PCT No.: PCT/CN2019/127053
§ 371 (c)(1),
(2) Date: Jun. 17, 2022

(87) PCT Pub. No.: WO2021/120183
PCT Pub. Date: Jun. 24, 2021

(65) Prior Publication Data
US 2023/0019011 A1 Jan. 19, 2023

(51) Int. Cl.
*H04B 7/08* (2006.01)

(52) U.S. Cl.
CPC ......... *H04B 7/0854* (2013.01); *H04B 7/0874* (2013.01)

(58) Field of Classification Search
CPC .. H04B 7/0854; H04B 7/0874; H03G 3/3052; H04L 25/03305
See application file for complete search history.

(56) References Cited

U.S. PATENT DOCUMENTS

| | | | | |
|---|---|---|---|---|
| 5,349,609 A | * | 9/1994 | Tsujimoto | H04B 7/0845 375/348 |
| 5,379,046 A | * | 1/1995 | Tsujimoto | H01Q 3/2611 455/278.1 |

(Continued)

FOREIGN PATENT DOCUMENTS

| | | | | |
|---|---|---|---|---|
| CA | 2419411 C | * | 1/1996 | |
| CA | 2200186 A1 | * | 5/1996 | |

(Continued)

OTHER PUBLICATIONS

Li, Ye, "Pilot-Symbol-Aided Channel Estimation for OFDM in Wireless Systems", IEEE Transactions on Vehicular Technology, vol. 49, No. 4, Jul. 2000, 1-9.

(Continued)

*Primary Examiner* — Jean B Corrielus
(74) *Attorney, Agent, or Firm* — Murphy, Bilak & Homiller, PLLC

(57) ABSTRACT

Various embodiments of the present disclosure provide a method for multi-antenna transmission. The method which may be performed by a communication device comprises determining first correlation information in response to interference to data on a first subset of multiple antenna branches of the communication device. The first correlation information may indicate at least correlation between the data on the first subset of the multiple antenna branches and data on a second subset of the multiple antenna branches which is not affected by interference. The method further comprises correcting the data on the first subset of the multiple antenna branches, based at least in part on the first correlation information.

20 Claims, 14 Drawing Sheets

(56) References Cited

U.S. PATENT DOCUMENTS

| | | | |
|---|---|---|---|
| 7,039,095 B2* | 5/2006 | Takahashi | H04W 52/346 375/148 |
| 10,382,109 B2 | 8/2019 | Li et al. | |
| 2012/0257696 A1 | 10/2012 | Mauritz et al. | |
| 2013/0223554 A1* | 8/2013 | Hong | H04B 7/0413 375/267 |
| 2016/0183232 A1 | 6/2016 | Stirling-Gallacher et al. | |
| 2018/0241484 A1 | 8/2018 | Larsson et al. | |
| 2019/0297603 A1 | 9/2019 | Guo et al. | |

FOREIGN PATENT DOCUMENTS

| | | | | |
|---|---|---|---|---|
| CN | 109863643 A | 6/2019 | | |
| EP | 1557943 B1 | 7/2011 | | |
| EP | 2632057 A1 | 8/2013 | | |
| WO | WO-2004010573 A1 * | 1/2004 | | H04B 1/71055 |
| WO | 2011068449 A1 | 6/2011 | | |
| WO | 2011068449 A9 | 7/2011 | | |
| WO | 2016148615 A1 | 9/2016 | | |
| WO | 2017045713 A1 | 3/2017 | | |
| WO | 2018068265 A1 | 4/2018 | | |
| WO | 2020227926 A1 | 11/2020 | | |

OTHER PUBLICATIONS

Von Butovitsch, Peter, et al., "Advanced antenna systems for 5G networks", Ericsson white paper, GFMC-18:000530, Nov. 2018, 1-15.

\* cited by examiner

METHOD AND APPARATUS FOR MULTI-ANTENNA COMMUNICATION

FIELD OF THE INVENTION

The present disclosure generally relates to communication networks, and more specifically, to method and apparatus for multi-antenna communication.

BACKGROUND

This section introduces aspects that may facilitate a better understanding of the disclosure. Accordingly, the statements of this section are to be read in this light and are not to be understood as admissions about what is in the prior art or what is not in the prior art.

Communication service providers and network operators have been continually facing challenges to deliver value and convenience to consumers by, for example, providing compelling network services and performance. With the rapid development of networking and communication technologies, wireless communication networks such as long-term evolution (LTE) and new radio (NR) networks are expected to achieve high traffic capacity and end-user data rate with lower latency. In order to meet dramatically increasing network requirements, one interesting option for communication technique development is to employ multiple antenna technology such as multiple input multiple output (MIMO) technology. Multiple antenna systems allow transmitting signals focused towards certain spatial regions. This creates beams (also referred to as beamforming) whose coverage can go beyond transmissions using non-beamformed signals. From the perspective of resource utilization, it may be advantageous to achieve potentially performance gain by implementing proper interference suppression in consideration of multi-antenna communication.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

In a wireless communication network such as 5G/NR network, a communication device such as a user equipment (UE) and a next generation NodeB (gNB) may be equipped with multiple antenna elements. In the context of MIMO communication, an active antenna system (AAS) may be employed to enhance network performance by enabling beamforming techniques. Currently, AAS automatic gain control (AGC) almost reuses the same concept as legacy AGC in radio communications. AGC may be used to control some analog attenuators so as to extend the dynamic range of a communication device. However, a glitch may be introduced at the AGC trigger/release point due to a non-ideal transient response of an attenuator. AGC trigger may represent the AGC state changed from low attenuation stage to high attenuation stage due to high input signal power, and AGC release may represent the AGC state changed from high attenuation state to low attenuation stage due to low input signal power. In order to avoid performance deterioration with the occurrence of glitches, it may be desirable to eliminate the effect of glitches in a more effective manner.

Various embodiments of the present disclosure propose a solution for multi-antenna communication, which can enable interference such as a glitch to be eliminated or completely removed by using correlation of multiple antenna branches. According to the proposed solution, the data contaminated by glitches can be compensated by using the data not contaminated by glitches, so that there is no performance degradation due to glitches.

According to a first aspect of the present disclosure, there is provided a method which may be performed by a communication device (e.g., a network node such as gNB, a terminal device such as UE, etc.). The method comprises determining first correlation information, in response to interference to data on a first subset of multiple antenna branches of the communication device. The first correlation information may indicate at least correlation between the data on the first subset of the multiple antenna branches and data on a second subset of the multiple antenna branches which is not affected by interference. The method further comprises correcting the data on the first subset of the multiple antenna branches, based at least in part on the first correlation information.

In accordance with some exemplary embodiments, the correction of the data on the first subset of the multiple antenna branches based at least in part on the first correlation information may comprise: obtaining the data on the second subset of the multiple antenna branches, and correcting the data on the first subset of the multiple antenna branches by using the data on the second subset of the multiple antenna branches, based at least in part on the first correlation information.

In accordance with some exemplary embodiments, the data on the first subset of the multiple antenna branches may be corrected by interpolating the data on the second subset of the multiple antenna branches.

In accordance with some exemplary embodiments, the first correlation information may be determined according to second correlation information which indicates correlation between data on the multiple antenna branches.

In accordance with some exemplary embodiments, the second correlation information may be determined by: collecting the data on the multiple antenna branches at one or more time points, and calculating correlation of the collected data in at least one of time domain and spatial domain to determine the second correlation information.

In accordance with some exemplary embodiments, the one or more time points may be within a time period during which the data on the multiple antenna branches is not affected by interference.

In accordance with some exemplary embodiments, the second correlation information may be updated according to a predefined rule.

In accordance with some exemplary embodiments, the interference to the data on the first subset of the multiple antenna branches may comprise glitches occurring on the first subset of the multiple antenna branches.

In accordance with some exemplary embodiments, the occurrence of the glitches may be randomized by asynchronously changing AGC on different antenna branches.

In accordance with some exemplary embodiments, the AGC on different antenna branches may be asynchronously changed by triggering the AGC on different antenna branches according to different trigger levels.

In accordance with some exemplary embodiments, the AGC on different antenna branches may be asynchronously changed by releasing the AGC on different antenna branches at different time points.

According to a second aspect of the present disclosure, there is provided an apparatus which may be implemented as a communication device. The apparatus may comprise one or more processors and one or more memories comprising computer program codes. The one or more memories and the computer program codes may be configured to, with the one or more processors, cause the apparatus at least to perform any step of the method according to the first aspect of the present disclosure.

According to a third aspect of the present disclosure, there is provided a computer-readable medium having computer program codes embodied thereon which, when executed on a computer, cause the computer to perform any step of the method according to the first aspect of the present disclosure.

According to a fourth aspect of the present disclosure, there is provided an apparatus which may be implemented as a communication device. The apparatus comprises a determining unit and a correcting unit. In accordance with some exemplary embodiments, the determining unit may be operable to carry out at least the determining step of the method according to the first aspect of the present disclosure. The correcting unit may be operable to carry out at least the correcting step of the method according to the first aspect of the present disclosure.

According to a fifth aspect of the present disclosure, there is provided a method implemented in a communication system which may include a host computer, a base station and a UE. The method may comprise providing user data at the host computer. Optionally, the method may comprise, at the host computer, initiating a transmission carrying the user data to the UE via a cellular network comprising the base station which may perform any step of the method according to the first aspect of the present disclosure.

According to a sixth aspect of the present disclosure, there is provided a communication system including a host computer. The host computer may comprise processing circuitry configured to provide user data, and a communication interface configured to forward the user data to a cellular network for transmission to a UE. The cellular network may comprise a base station having a radio interface and processing circuitry. The base station's processing circuitry may be configured to perform any step of the method according to the first aspect of the present disclosure.

According to a seventh aspect of the present disclosure, there is provided a method implemented in a communication system which may include a host computer, a base station and a UE. The method may comprise providing user data at the host computer. Optionally, the method may comprise, at the host computer, initiating a transmission carrying the user data to the UE via a cellular network comprising the base station. The UE may perform any step of the method according to the first aspect of the present disclosure.

According to an eighth aspect of the present disclosure, there is provided a communication system including a host computer. The host computer may comprise processing circuitry configured to provide user data, and a communication interface configured to forward user data to a cellular network for transmission to a UE. The UE may comprise a radio interface and processing circuitry. The UE's processing circuitry may be configured to perform any step of the method according to the first aspect of the present disclosure.

According to a ninth aspect of the present disclosure, there is provided a method implemented in a communication system which may include a host computer, a base station and a UE. The method may comprise, at the host computer, receiving user data transmitted to the base station from the UE which may perform any step of the method according to the first aspect of the present disclosure.

According to a tenth aspect of the present disclosure, there is provided a communication system including a host computer. The host computer may comprise a communication interface configured to receive user data originating from a transmission from a UE to a base station. The UE may comprise a radio interface and processing circuitry. The UE's processing circuitry may be configured to perform any step of the method according to the first aspect of the present disclosure.

According to an eleventh aspect of the present disclosure, there is provided a method implemented in a communication system which may include a host computer, a base station and a UE. The method may comprise, at the host computer, receiving, from the base station, user data originating from a transmission which the base station has received from the UE. The base station may perform any step of the method according to the first aspect of the present disclosure.

According to a twelfth aspect of the present disclosure, there is provided a communication system which may include a host computer. The host computer may comprise a communication interface configured to receive user data originating from a transmission from a UE to a base station. The base station may comprise a radio interface and processing circuitry. The base station's processing circuitry may be configured to perform any step of the method according to the first aspect of the present disclosure.

BRIEF DESCRIPTION OF THE DRAWINGS

The disclosure itself, the preferable mode of use and further objectives are best understood by reference to the following detailed description of the embodiments when read in conjunction with the accompanying drawings, in which.

DETAILED DESCRIPTION

Figure 1:
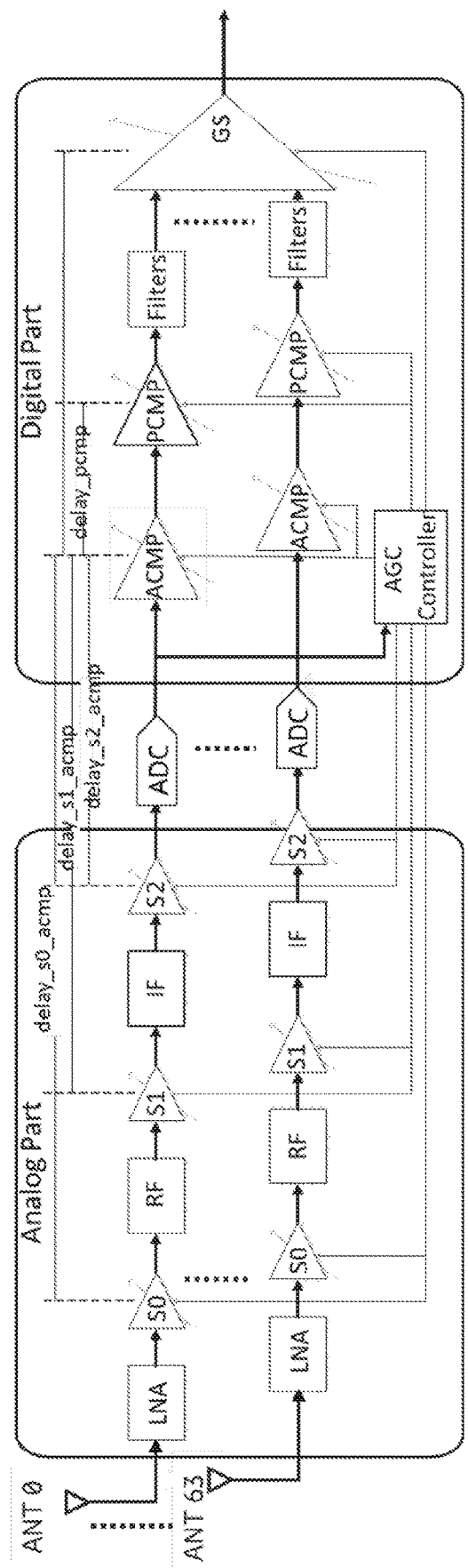
FIG. 1 is a diagram illustrating exemplary AGC and the peripheral thereof according to an embodiment of the present disclosure.

The embodiments of the present disclosure are described in detail with reference to the accompanying drawings. It should be understood that these embodiments are discussed only for the purpose of enabling those skilled persons in the art to better understand and thus implement the present disclosure, rather than suggesting any limitations on the scope of the present disclosure. Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Furthermore, the described features, advantages, and characteristics of the disclosure may be combined in any suitable manner in one or more embodiments. One skilled in the relevant art will recognize that the disclosure may be practiced without one or more of the specific features or advantages of a particular embodiment. In other instances, additional features and advantages may be recognized in certain embodiments that may not be present in all embodiments of the disclosure.

As used herein, the term "communication network" refers to a network following any suitable communication standards, such as new radio (NR), long term evolution (LTE), LTE-Advanced, wideband code division multiple access (WCDMA), high-speed packet access (HSPA), and so on. Furthermore, the communications between a terminal device and a network node in the communication network may be performed according to any suitable generation communication protocols, including, but not limited to, the first generation (1G), the second generation (2G), 2.5G, 2.75G, the third generation (3G), 4G, 4.5G, 5G communication protocols, and/or any other protocols either currently known or to be developed in the future.

The term "network node" refers to a network device in a communication network via which a terminal device accesses to the network and receives services therefrom. The network node may refer to a base station (BS), an access point (AP), a multi-cell/multicast coordination entity (MCE), a controller or any other suitable device in a wireless communication network. The BS may be, for example, a node B (NodeB or NB), an evolved NodeB (eNodeB or eNB), a next generation NodeB (gNodeB or gNB), a remote radio unit (RRU), a radio header (RH), a remote radio head (RRH), a relay, a low power node such as a femto, a pico, and so forth.

Yet further examples of the network node comprise multi-standard radio (MSR) radio equipment such as MSR BSs, network controllers such as radio network controllers (RNCs) or base station controllers (BSCs), base transceiver stations (BTSs), transmission points, transmission nodes, positioning nodes and/or the like. More generally, however, the network node may represent any suitable device (or group of devices) capable, configured, arranged, and/or operable to enable and/or provide a terminal device access to a wireless communication network or to provide some service to a terminal device that has accessed to the wireless communication network.

The term "terminal device" refers to any end device that can access a communication network and receive services therefrom. By way of example and not limitation, the terminal device may refer to a mobile terminal, a user equipment (UE), or other suitable devices. The UE may be, for example, a subscriber station, a portable subscriber station, a mobile station (MS) or an access terminal (AT). The terminal device may include, but not limited to, portable computers, image capture terminal devices such as digital cameras, gaming terminal devices, music storage and playback appliances, a mobile phone, a cellular phone, a smart phone, a tablet, a wearable device, a personal digital assistant (PDA), a vehicle, and the like.

As yet another specific example, in an Internet of things (IoT) scenario, a terminal device may also be called an IoT device and represent a machine or other device that performs monitoring, sensing and/or measurements etc., and transmits the results of such monitoring, sensing and/or measurements etc. to another terminal device and/or a network equipment. The terminal device may in this case be a machine-to-machine (M2M) device, which may in a 3rd generation partnership project (3GPP) context be referred to as a machine-type communication (MTC) device.

As one particular example, the terminal device may be a UE implementing the 3GPP narrow band Internet of things (NB-IoT) standard. Particular examples of such machines or devices are sensors, metering devices such as power meters, industrial machinery, or home or personal appliances, e.g. refrigerators, televisions, personal wearables such as watches etc. In other scenarios, a terminal device may represent a vehicle or other equipment, for example, a medical instrument that is capable of monitoring, sensing and/or reporting etc. on its operational status or other functions associated with its operation.

As used herein, the terms "first", "second" and so forth refer to different elements. The singular forms "a" and "an" are intended to include the plural forms as well, unless the context clearly indicates otherwise. The terms "comprises", "comprising", "has", "having", "includes" and/or "including" as used herein, specify the presence of stated features, elements, and/or components and the like, but do not preclude the presence or addition of one or more other features, elements, components and/or combinations thereof. The term "based on" is to be read as "based at least in part on". The term "one embodiment" and "an embodiment" are to be read as "at least one embodiment". The term "another embodiment" is to be read as "at least one other embodiment". Other definitions, explicit and implicit, may be included below.

Multi-antenna technology such as massive MIMO may have lots of attractive merits and can be regarded as an iconic technology of a communication system such as NR/5G system. An AAS can enable beamforming and MIMO techniques that are powerful tools for improving end-user experience, capacity and coverage. Currently, the AAS may utilize or reuse some existing communication components and signal processing procedures. For example, the same concept as legacy AGC may be reused by the AAS in macro radio. The only update of AGC for the AAS may be utilizing the summed power of many antennas to save compute resource in an AGC controller, without considering the redundancy between antennas.

AGC may play an indispensable role to maximize the usage of linear region, which can extend the dynamic range by controlling some analog attenuators. The dynamic range of a receiver may be determined by the analog components such as a mixer and an analog-to-digital (ADC) unit. Normally, these components may not offer enough dynamic range for uplink/downlink communication. If the incoming signal is strong, the attenuators may be enabled to reduce input power, and if the incoming signal is weak, the attenuators may be disabled to minimize the noise. Nevertheless, the transient response of an attenuator may not be ideal and may introduce a glitch at the AGC trigger/release point. The glitch looks like the impulse interference and may deteriorate the system throughput.

Some efforts may be made to mitigate glitches. There are several glitch suppression functions or schemes. One possible scheme is to remove the glitches with zero insertion. However, whether to use zero insertion may depend on the signal power. Dynamic glitch suppression is thus addressed by detecting the signal power, and then it may be decided whether to remove the glitch with zero insertion or reserve the glitch. Another possible scheme is to report information to a digital unit (DU) and let the DU decide how to handle the glitches. These schemes may be utilized to avoid worsening the performance.

Unfortunately, all existing schemes cannot remove glitches completely. If an AGC response is quick, too many glitches may deteriorate the performance, and if an AGC response is slow, the length of saturation may also lead to performance degradation. As a result, an AGC designer may need to compromise between the occurrence of glitches and the AGC response time. No good solution so far can realize the true glitch-free for AAS AGC.

In order to solve at least one of the existing issues, various exemplary embodiments of the present disclosure propose a glitch-free AGC solution for a multi-antenna system such as an AAS. According to the proposed solution, a new glitch correction may be introduced, for example, based on the time/spatial correlation of multiple antenna branches of a communication device. In accordance with some exemplary embodiments, AGC of different antenna branches may be triggered and/or released asynchronously, for example, according to different signal levels and/or time points. According to an exemplary embodiment, a correlation matrix can be calculated by using the data collected on multiple antenna branches. The correlation matrix may be updated slowly in a long period, or quickly after AGC state change. In response to AGC being triggered/released on one or more antenna branches, the interpolation between data on antenna branches may be carried out by using a minimum mean-squared error (MMSE) estimator. The missing information due to glitches may be recovered by utilizing the time/spatial correction between data on antenna branches. In an exemplary embodiment, the data contaminated by glitches may be compensated by using the data not contaminated by glitches. In this way, the glitch-free AGC can be realized and numerous functions of the communication device can enjoy the benefits due to this enhancement.

FIG. 1 is a diagram illustrating exemplary AGC and peripheral thereof according to an embodiment of the present disclosure. For simplicity, FIG. 1 only depicts some exemplary communication parts or components of a receiver configured with multiple antennas. It will be appreciated that there may be more or less alternative components or elements can be deployed at the receiver to implement multi-antenna communication. As shown in FIG. 1, for an antenna branch, the peripheral of AGC may include an analog part (e.g., comprising a low noise amplifier (LNA), a radio frequency (RF) mixer, an intermediate frequency (IF) mixer, three attenuators S0, S1 and S2) and a digital part (e.g., comprising an amplitude compensator (ACMP), a phase compensator (PCMP), filters, and a glitch suppressor (GS)). The attenuators S0, S1 and S2 may be used to ensure proper input power for each component. According to an exemplary embodiment, S0, S1 and S2 may be used for the RF mixer, the IF mixer and an ADC, respectively. In some cases, the attenuators may be simplified to one or two attenuators.

The analog gain changed by the attenuators can be compensated in digital domain, composing of transparent process to a DU. The ACMP can multiply the amplitude difference against the reference state. The PCMP can add the phase difference against the reference state. The exemplary AGC controller shown in FIG. 1 may have a typical AGC function used in a communication link system (e.g., an uplink system, etc.). There may be some signal delay between the components, e.g., the delay "delay_s0_acmp" from the attenuator S0 to the ACMP, the delay "delay_s1_acmp" from the attenuator S1 to the ACMP, the delay "delay_s2_acmp" from the attenuator S2 to the ACMP, the delay "delay_pcmp" from the ACMP to the PCMP, as shown in FIG. 1.

According to an exemplary embodiment, a communication device such as a BS or a UE may be equipped with multiple antenna branches (e.g., ANT 0 to ANT 63 shown in FIG. 1) for data communications, and each antenna branch may be configured with the corresponding AGC. Ideally, AGC may only change the gain distribution between analog domain and digital domain, without changing the overall gain. For this reason, the variations of AGC need to be rarely observed by the DU, so that the device architecture can be simplified in some exemplary embodiments.

Figure 2A:
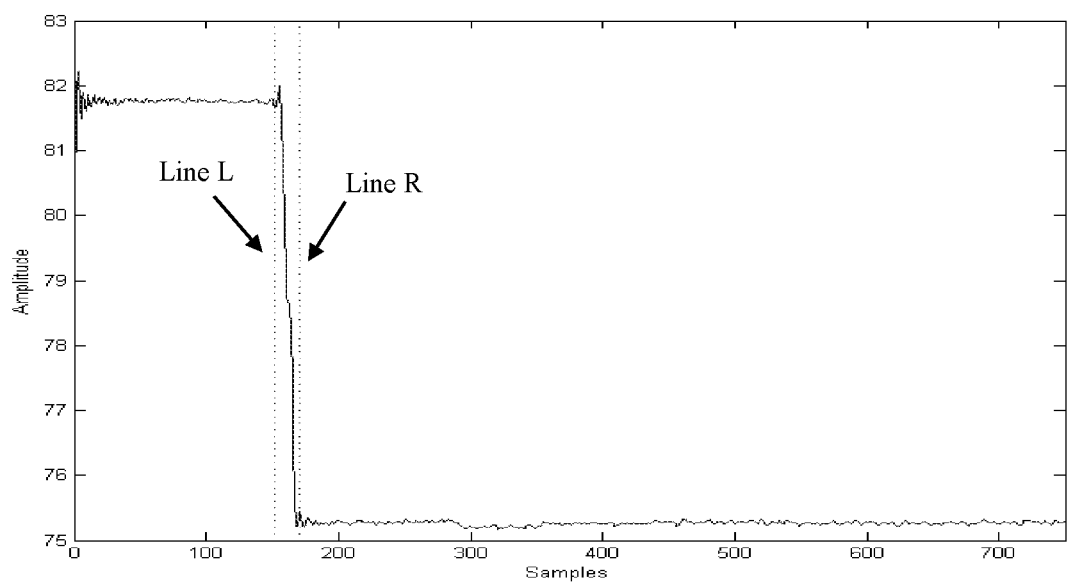
FIG. 2A is a diagram illustrating an example of transient response of an attenuator according to an embodiment of the present disclosure.

FIG. 2A is a diagram illustrating an example of transient response of an attenuator according to an embodiment of the present disclosure. In this example, the continuous wave (CW) is used as a stimuli signal. In practice, the attenuator may not change its state perfectly. It can be seen from FIG. 2A that the attenuator attempts to decrease the signal power at line L, but the work is finished at line R. The behavior between the two lines may be defined as transient response, which is unstable and uncontrollable. The change of amplitude and phase can be compensated by the ACMP and the PCMP as shown in FIG. 1. However, no matter which point is chosen, the data within the transient response may not be compensated, and in this case a glitch may be generated.

Figure 2B:
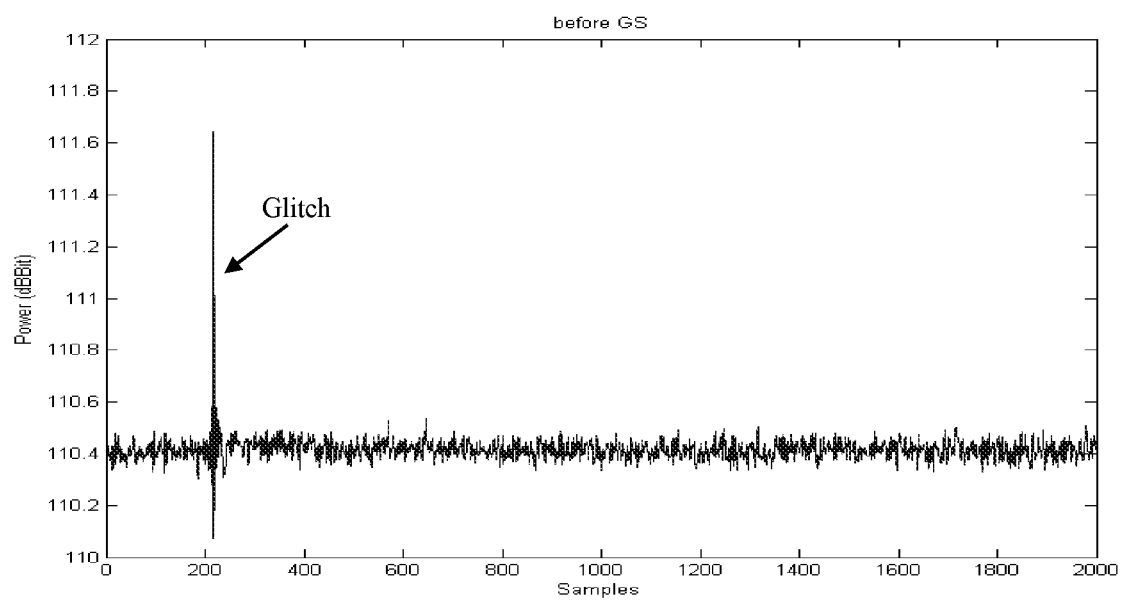
FIGS. 2B-2C are diagrams illustrating exemplary received data samples according to some embodiments of the present disclosure.
Figure 2C:
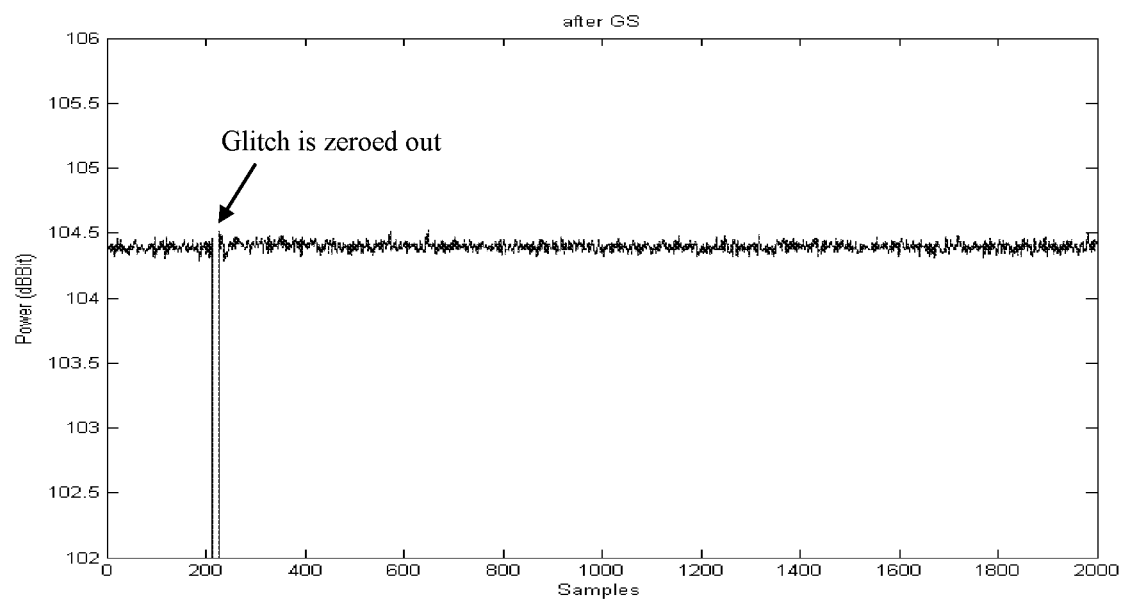

FIGS. 2B-2C are diagrams illustrating exemplary received data samples according to some embodiments of the present disclosure. Specifically, FIG. 2B depicts the received data samples at the output of a PCMP (e.g., the PCMP as shown in FIG. 1) and before a GS (e.g., the GS as shown in FIG. 1), where a glitch occurs at the state transition point and looks like impulse interference. The GS may be added to mitigate glitches with zeros, i.e. glitch suppression. FIG. 2C depicts the received data samples at the output of the GS. According to an exemplary embodiment, the useful data and the glitch may be discarded together, as shown in FIG. 2C. The GS can remove the glitch at the cost of missing some useful data. In some scenarios, glitches may occur frequently within a time slot. Too many glitches in a period may deteriorate the throughput in an unpredictable way.

Figure 3:
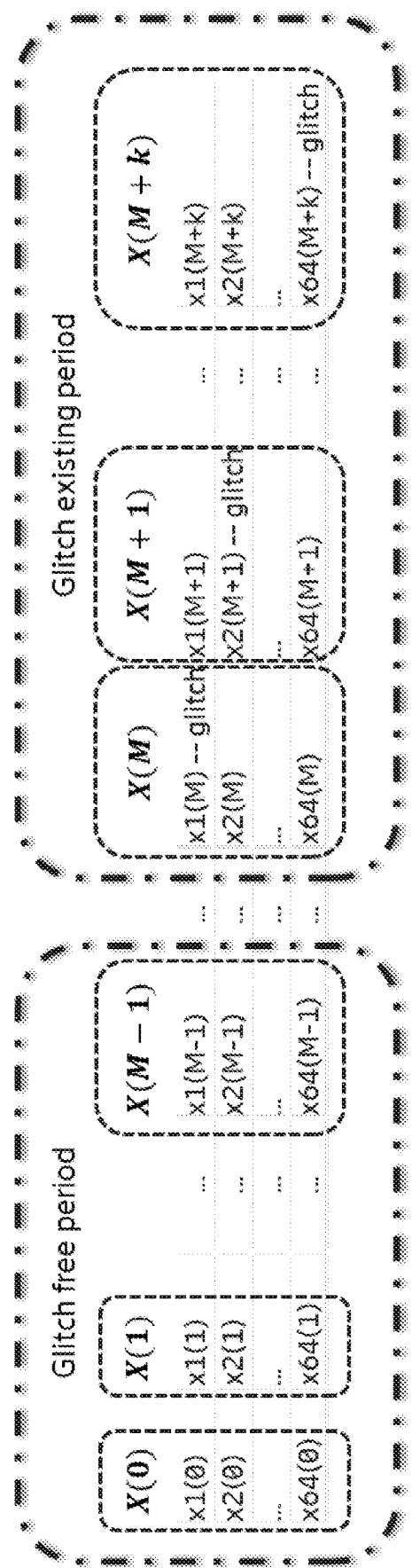
FIG. 3 is a diagram illustrating exemplary data on multiple antenna branches according to an embodiment of the present disclosure.

FIG. 3 is a diagram illustrating exemplary data on multiple antenna branches according to an embodiment of the present disclosure. As shown in FIG. 3, the received data for all antenna branches in a communication link (e.g., uplink or downlink) may be divided into two parts, one part of the data is within a "Glitch free period" where there is no AGC change happening, and the other part is within a "Glitch existing period" where AGC is triggered/released and at least one glitch happens meanwhile. The data on N antenna branches at ith moment may be represented by $X(i)=\{x_1(i), x_2(i), \ldots, x_n(i), \ldots x_N(i)\}$, where $x_n(i)$ represents the data on nth antenna branch at ith moment. In FIG. 3, there are N=64 antenna branches, the sample moments $i=\{0, 1, \ldots, M-1\}$ are within the "Glitch free period", and the sample moments $i=\{M, M+1, \ldots, M+k\}$ are within the "Glitch existing period".

In accordance with some exemplary embodiments, glitches may be corrected based at least in part on time and/or spatial correlation of multiple antenna branches. A correlation matrix may be calculated by using the data collected on each antenna branch, for example, during the "Glitch free period". Optionally, the collected data may be stored in a memory configured for each antenna branch. In an embodiment, the correlation matrix R (i+1) can be calculated according to the following formula:

$$R(i+1)=\lambda R(i)+(1-\lambda)X(i)X(i)^* \quad (1)$$

where X(i) represents the received data at ith moment, X(i)* is the conjugate transpose of X(i), and $\lambda$ is a forgetting factor between 0 and 1. When $\lambda$ approaches 1, the history data may be emphasized, and when $\lambda$ approaches 0, the recent data may be emphasized. The data collection may be started with R (i)=I (where I is an identity matrix), and performed at a period of T. Increasing T can relief the burden of computation, and decreasing T can track the change more tightly. As known, the AAS usually may have more antennas than users, that is to say, the data over spatial domain may be oversampled.

In accordance with some exemplary embodiments, although AGC may be triggered by a high-level signal at the ADC interface as shown in FIG. 1, the data from the ACMP to the GS may be still valid due to delay and thereby can be utilized to renew the correlation matrix. The typical value of this delay is around several microsecond (μs), mainly introduced by digital filters. In this specific period (also called "delay period") within the "Glitch existing period", the correlation matrix may be calculated per sample to catch up the recent change.

In accordance with some exemplary embodiments, the data contaminated by glitches may be corrected by interpolating the data not contaminated by glitches, based at least in part on the correlation matrix. According to an exemplary embodiment, the interpolation may be performed with an MMSE estimator using the following formula:

$$\tilde{X}(i)=R_{\tilde{X}\tilde{X}}^{-1}R_{\tilde{X}\bar{X}}\bar{X}(i) \quad (2)$$

where $\bar{X}(i)$ represents the good data which is pick up from the received data X(i) and not contaminated by one or more glitches at ith moment, the resultant $\tilde{X}(i)$ represents the renewed data which is a correction to the bad data $\tilde{X}_{glitch}(i)$ that has been impacted by one or more glitches, $R_{\tilde{X}\tilde{X}}$ denotes the correlation between the bad data from different antenna branches on which the glitches occur, and $R_{\tilde{X}\bar{X}}$ denotes the correlation between the bad data and the good data. $R_{\tilde{X}\tilde{X}}$ and $RR_{\tilde{X}\bar{X}}$ can be derived from the related correlation information (e.g., R (i) which may be calculated according to formula (1)), and/or obtained from statistical information or training data indicating correlation between multiple antenna branches. According to some exemplary embodiments, the positions of the one or more glitches may be known because the AGC can be supervised with precise time alignment. In an embodiment, only the good data not contaminated by glitches may be exploited.

It can be appreciated that although the above glitch correction is mainly described with respect to the correlation matrix according to formula (1) and the interpolation with an MMSE estimator according to formula (2), the proposed glitch-free AGC solution for multi-antenna communication can be extended to various applications of interference suppression and/or data correction in a feasible way according to other suitable schemes or rules.

In accordance with some exemplary embodiments, glitch randomness may be important for glitch correction. At one moment, the majority of data may need to be valid. Otherwise, the estimation error may be large. To implement the glitch correction more effectively, the data on at least some branches may need to be valid, i.e. not contaminated by glitches. It can be realized that the glitch randomness may be held by many factors. For example, since the interference may come from non-zero degree, the delay of arrival at each antenna may be different, and the occurrence of glitches may not be the same at each antenna. Another possible factor may be that the uplink/downlink gain of each antenna is not equivalent. Currently, since the AAS uses the low-cost transceiver, the gains indeed may not be perfectly aligned. In a corner case (e.g., the interference is injected from zero degree, and the gains are perfectly aligned), the triggering thresholds for AGC on different antenna branches may be set to different values to randomize the glitches. Alternatively or additionally, AGC release for different antenna branches also may be controlled by setting different release times.

Figure 4:
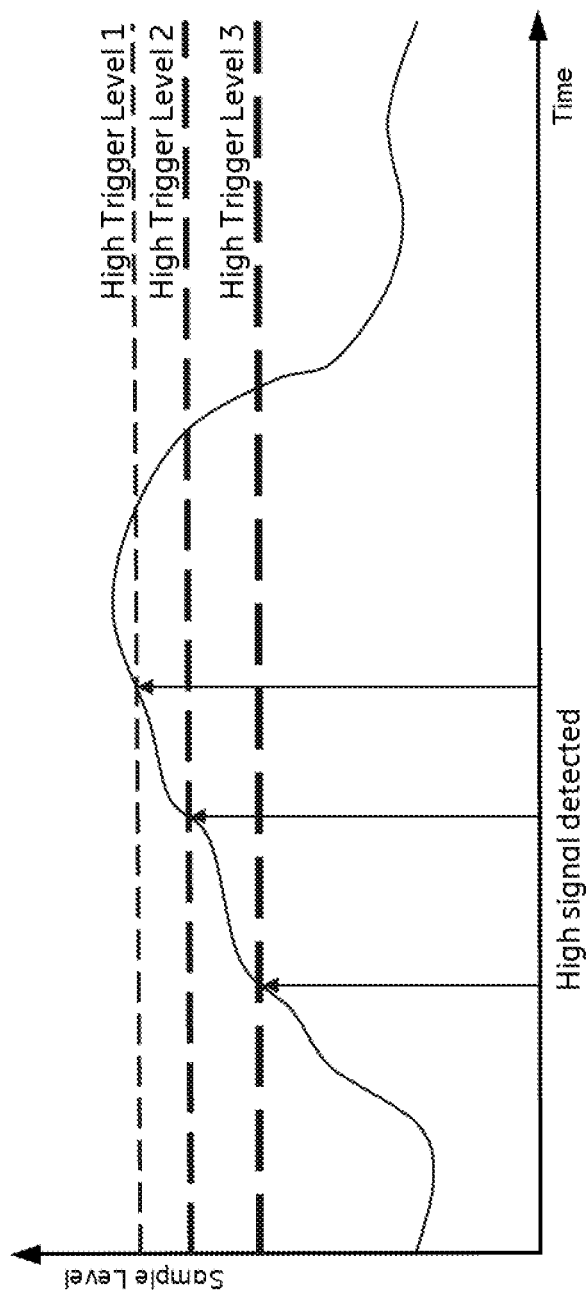
FIG. 4 is a diagram illustrating exemplary configuration of trigger levels according to an embodiment of the present disclosure.

FIG. 4 is a diagram illustrating exemplary configuration of trigger levels according to an embodiment of the present disclosure. For an antenna branch, AGC may be triggered in response to a high-level signal detected at an ADC interface. Correspondingly, a glitch may be introduced on this antenna branch. In order to randomize the occurrence of glitches on different antenna branches, different "High Trigger Levels" (e.g., High Trigger Levels 1, 2 and 3 as shown in FIG. 4) may be configured to asynchronously trigger AGC for different antenna branches. According to an exemplary embodiment, "High Trigger Level" may be set to slightly different values, e.g. between [−2, −0.5] dBFs. The difference in power levels may result in difference in glitch delays.

Figure 5:
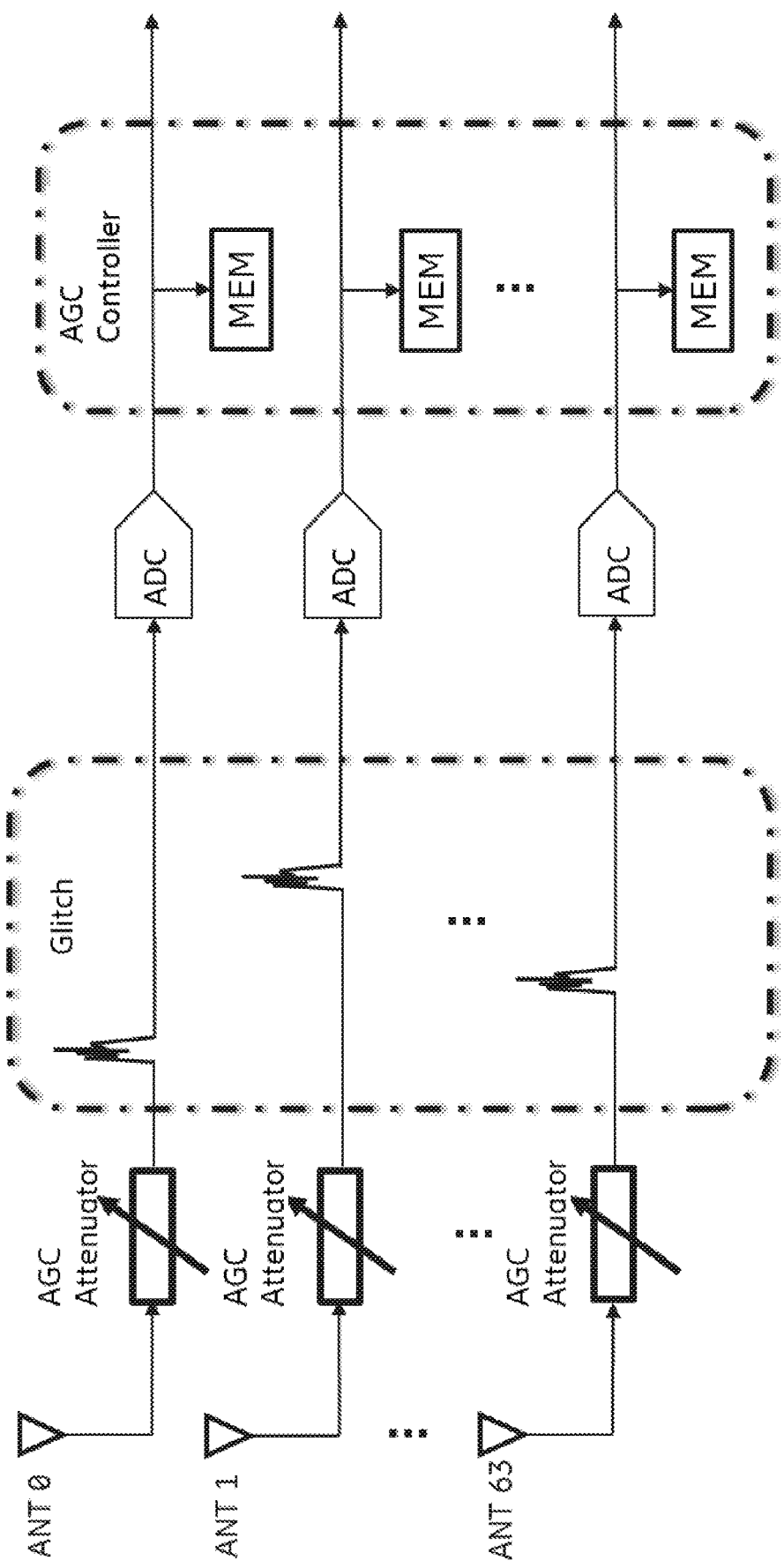
FIG. 5 is a diagram illustrating exemplary glitch-free AGC according to an embodiment of the present disclosure.

FIG. 5 is a diagram illustrating exemplary glitch-free AGC according to an embodiment of the present disclosure. The exemplary glitch-free AGC may be applicable to a receiver configured with multiple antenna branches, e.g., 64 antenna branches as shown in FIG. 5. According to the exemplary glitch-free AGC, a memory (MEM) with enough size may be configured for data collection of an antenna branch (e.g., ANT 0, ANT 1, . . . , ANT 63). In addition to memories, FIG. 5 also depicts some exemplary components or elements configured for the respective antenna branches, such as AGC attenuators, ADCs and an AGC controller. It will be appreciated that there may be more or less alternative components or elements can be deployed at the antenna branches to implement multi-antenna communication with glitch-free AGC. For example, one or more calculators may be configured for calculating a correlation matrix and/or performing data interpolation. Alternatively or additionally, the correlation matrix or other parameter(s) indicating correlation of antenna branches may be determined or obtained by accessing one or more databases storing correlation information of the antenna branches. Optionally, different triggering thresholds (and/or releasing time points) may be set to trigger (and/or release) the AGC of different antenna branches asynchronously.

It is noted that some embodiments of the present disclosure are mainly described in relation to 5G or NR specifications being used as non-limiting examples for certain exemplary network configurations and system deployments. As such, the description of exemplary embodiments given herein specifically refers to terminology which is directly related thereto. Such terminology is only used in the context of the presented non-limiting examples and embodiments, and does naturally not limit the present disclosure in any way. Rather, any other system configuration or radio technologies may equally be utilized as long as exemplary embodiments described herein are applicable.

Figure 6:
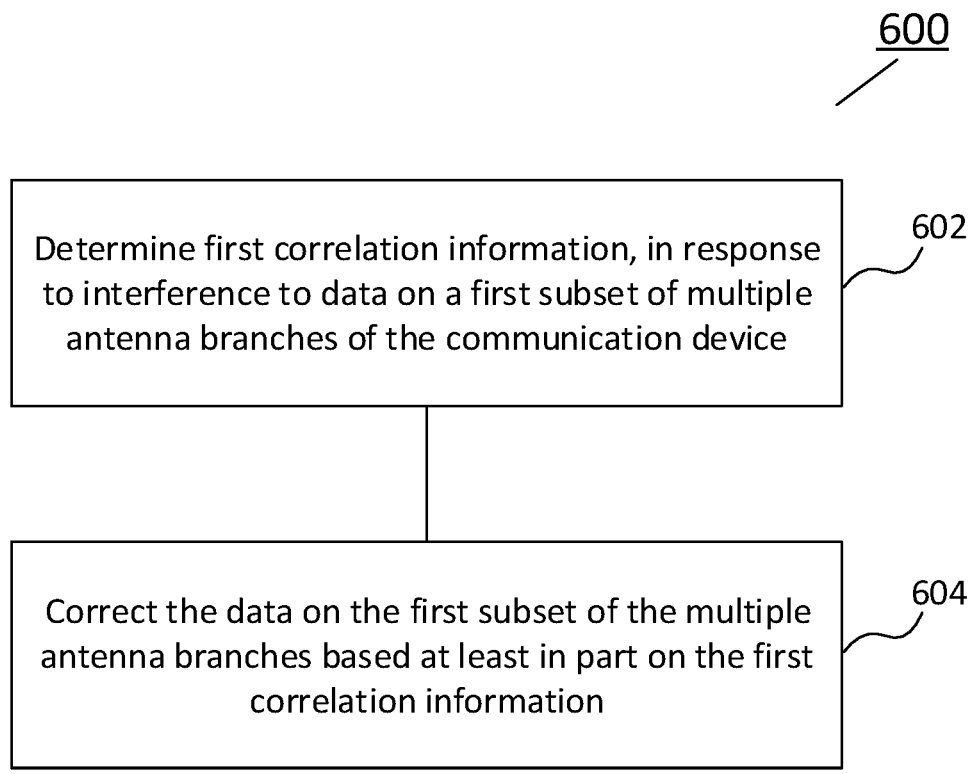
FIG. 6 is a flowchart illustrating a method according to some embodiments of the present disclosure.

FIG. 6 is a flowchart illustrating a method 600 according to some embodiments of the present disclosure. The method 600 illustrated in FIG. 6 may be performed by a communication device or an apparatus communicatively coupled to the communication device. In accordance with an exemplary embodiment, the communication device may comprise a network node (e.g., a BS, an AP, etc.) or a terminal device (e.g., a UE, a MS, etc.). The communication device may be configured to support multi-antenna communications with other radio devices.

According to the exemplary method 600 illustrated in FIG. 6, the communication device can determine first correlation information in response to interference to data on a first subset of multiple antenna branches of the communication device, as shown in block 602. The first correlation information may indicate at least correlation (e.g., $R_{\tilde{X}\tilde{X}}$ as described with respect to formula (2)) between the data on the first subset (e.g., $\tilde{X}(i)$ as described with respect to formula (2)) of the multiple antenna branches and data on a second subset (e.g., $\overline{X}(i)$ as described with respect to formula (2)) of the multiple antenna branches which is not affected by interference.

In accordance with some exemplary embodiments, the interference to the data on the first subset of the multiple antenna branches may comprise glitches occurring on the first subset of the multiple antenna branches. Alternatively or additionally, the interference to the data on the first subset of the multiple antenna branches may comprise other possible signals which contaminates or destroys the data on the first subset of the multiple antenna branches.

In accordance with some exemplary embodiments, the first correlation information may further indicate correlation (e.g., $R_{\tilde{X}\tilde{X}}$ as described with respect to formula (2)) between the data on each antenna branch of the first subset of the multiple antenna branches. In an exemplary embodiment, the first correlation information can be determined according to second correlation information which indicates correlation (e.g., R(i) as described with respect to formula (1)) between data on the multiple antenna branches.

In accordance with some exemplary embodiments, the second correlation information can be determined by collecting the data on the multiple antenna branches at one or more time points, and calculating correlation of the collected data in at least one of time domain and spatial domain (e.g., according to formula (1)) to determine the second correlation information. It can be appreciated that various possible statistical and/or training schemes may be used to calculate or estimate the correlation of data collected on the multiple antenna branches.

In accordance with some exemplary embodiments, the one or more time points may be within a specific time period during which the data on the multiple antenna branches is not affected by interference. According to an exemplary embodiment, the specific time period may comprise a first period (e.g., the "Glitch free period" as described with respect to FIG. 3) where there is no AGC change (such as triggering/releasing) happening and the AGC is stable. Optionally, the specific time period may further comprise a second period (e.g., the "delay period" within the "Glitch existing period" as described with respect to FIG. 3) where the data in a digital part (e.g., the digital part as shown in FIG. 1) of the communication device may be still valid due to interference delay.

In accordance with some exemplary embodiments, the second correlation information may be updated or calculated according to a predefined rule. For example, the second correlation information (e.g., a correlation matrix such as R (i), etc.) may be updated or calculated with different rates at different time periods. According to an exemplary embodiment, the second correlation information may be calculated by the data collected during the "Glitch free period" in a slow update rate. Alternatively or additionally, the second correlation information may be calculated by the data collected during the "Glitch existing period" (e.g., the "delay period" or other possible time period) in a fast update rate.

According to the exemplary method 600 illustrated in FIG. 6, the communication device can correct the data on the first subset of the multiple antenna branches, based at least in part on the first correlation information, as shown in block 604. In this way, the effect of interference (e.g., one or more glitches) to the data on the first subset of the multiple antenna branches may be eliminated by utilizing the correlation between antenna branches.

In accordance with some exemplary embodiments, the correction of the data on the first subset of the multiple antenna branches based at least in part on the first correlation information may comprise: obtaining the data on the second subset of the multiple antenna branches, and correcting the data on the first subset of the multiple antenna branches by using the data on the second subset of the multiple antenna branches, based at least in part on the first correlation information.

According to an exemplary embodiment, the data on the first subset of the multiple antenna branches may be corrected by interpolating the data on the second subset of the multiple antenna branches. For example, the interpolation may be performed by using an MMSE estimator according to formula (2). As such, the data contaminated by glitches can be corrected using the data not contaminated by glitches.

In accordance with some exemplary embodiments, the occurrence of the glitches may be randomized by asynchronously changing AGC on different antenna branches. According to an exemplary embodiment, the AGC on different antenna branches may be asynchronously changed by: triggering the AGC on different antenna branches according to different trigger levels (e.g., High Trigger Levels 1, 2 and 3 as described with respect to FIG. 4, or other suitable levels). Alternatively or additionally, the AGC on different antenna branches may be asynchronously changed by: releasing the AGC on different antenna branches at different time points. Optionally, the asynchronized trigger/release of the AGC may be realized by manually changing the link budgets of one or more antenna branches. Triggering/releasing the AGC in an asynchronous manner can make it more effective to compensate the glitches on some antenna branches according to the good data on other antenna branches.

The proposed solution according to some exemplary embodiments can enable AGC functionalities to be simplified with a glitch-free feature. According to the proposed solution, interference such as glitches may be corrected or removed completely by using time and/or spatial correlation between data on multiple antenna branches. In an exemplary embodiment, AGC can be triggered and/or released quickly according to an input signal, without degradation of performance due to glitches. Some exemplary embodiments of the present disclosure may support to add more analog attenuation levels to save high-resolution ADC. Optionally, some exemplary embodiments may be applicable to operating the AAS with field programmable gate arrays (FPGA) update.

The various blocks shown in FIG. 6 may be viewed as method steps, and/or as operations that result from operation of computer program code, and/or as a plurality of coupled logic circuit elements constructed to carry out the associated function(s). The schematic flow chart diagrams described above are generally set forth as logical flow chart diagrams. As such, the depicted order and labeled steps are indicative of specific embodiments of the presented methods. Other steps and methods may be conceived that are equivalent in function, logic, or effect to one or more steps, or portions thereof, of the illustrated methods. Additionally, the order in which a particular method occurs may or may not strictly adhere to the order of the corresponding steps shown.

Figure 7:
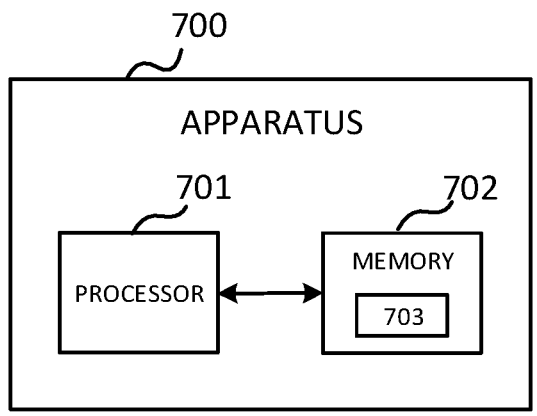
FIG. 7 is a block diagram illustrating an apparatus according to some embodiments of the present disclosure.

FIG. 7 is a block diagram illustrating an apparatus 700 according to various embodiments of the present disclosure. As shown in FIG. 7, the apparatus 700 may comprise one or more processors such as processor 701 and one or more memories such as memory 702 storing computer program codes 703. The memory 702 may be non-transitory machine/processor/computer readable storage medium. In accordance with some exemplary embodiments, the apparatus 700 may be implemented as an integrated circuit chip or module that can be plugged or installed into a communication device as described with respect to FIG. 6. In such case, the apparatus 700 may be implemented as a communication device as described with respect to FIG. 6.

In some implementations, the one or more memories 702 and the computer program codes 703 may be configured to, with the one or more processors 701, cause the apparatus 700 at least to perform any operation of the method as described in connection with FIG. 6. Alternatively or additionally, the one or more memories 702 and the computer program codes 703 may be configured to, with the one or more processors 701, cause the apparatus 700 at least to perform more or less operations to implement various methods according to exemplary embodiments of the present disclosure.

Figure 8:
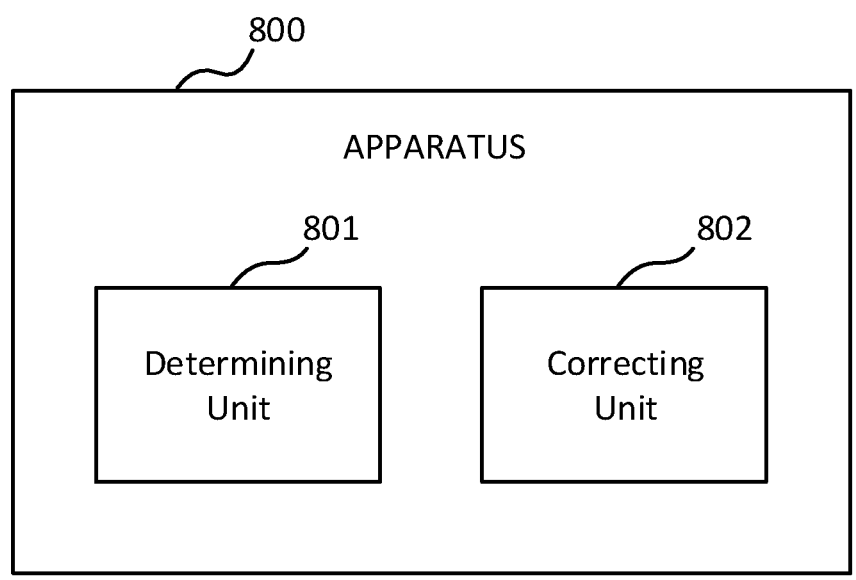
FIG. 8 is a block diagram illustrating another apparatus according to some embodiments of the present disclosure.

FIG. 8 is a block diagram illustrating an apparatus 800 according to some embodiments of the present disclosure. As shown in FIG. 8, the apparatus 800 may comprise a determining unit 801 and a correcting unit 802. In an exemplary embodiment, the apparatus 800 may be implemented in a communication device such as a network node or a terminal device. The determining unit 801 may be operable to carry out the operation in block 602, and the correcting unit 802 may be operable to carry out the operation in block 604. Optionally, the determining unit 801 and/or the correcting unit 802 may be operable to carry out more or less operations to implement the proposed methods according to exemplary embodiments of the present disclosure.

Figure 9:
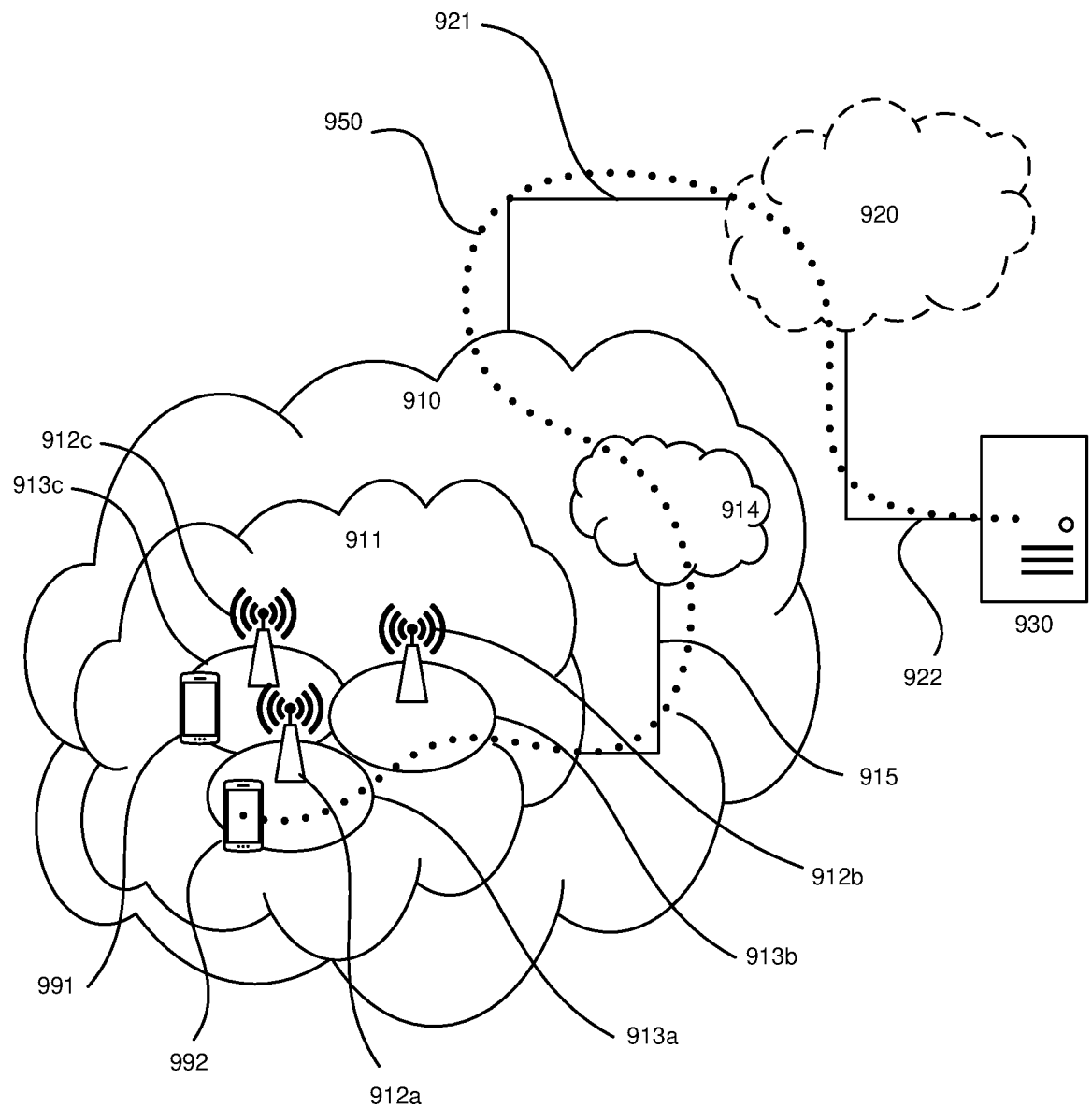
FIG. 9 is a block diagram illustrating a telecommunication network connected via an intermediate network to a host computer in accordance with some embodiments of the present disclosure.

FIG. 9 is a block diagram illustrating a telecommunication network connected via an intermediate network to a host computer in accordance with some embodiments of the present disclosure.

With reference to FIG. 9, in accordance with an embodiment, a communication system includes a telecommunication network 910, such as a 3GPP-type cellular network, which comprises an access network 911, such as a radio access network, and a core network 914. The access network 911 comprises a plurality of base stations 912a, 912b, 912c, such as NBs, eNBs, gNBs or other types of wireless access points, each defining a corresponding coverage area 913a, 913b, 913c. Each base station 912a, 912b, 912c is connectable to the core network 914 over a wired or wireless connection 915. A first UE 991 located in a coverage area 913c is configured to wirelessly connect to, or be paged by, the corresponding base station 912c. A second UE 992 in a coverage area 913a is wirelessly connectable to the corresponding base station 912a. While a plurality of UEs 991, 992 are illustrated in this example, the disclosed embodiments are equally applicable to a situation where a sole UE is in the coverage area or where a sole UE is connecting to the corresponding base station 912.

The telecommunication network 910 is itself connected to a host computer 930, which may be embodied in the hardware and/or software of a standalone server, a cloud-implemented server, a distributed server or as processing resources in a server farm. The host computer 930 may be under the ownership or control of a service provider, or may be operated by the service provider or on behalf of the service provider. Connections 921 and 922 between the telecommunication network 910 and the host computer 930 may extend directly from the core network 914 to the host computer 930 or may go via an optional intermediate network 920. An intermediate network 920 may be one of, or a combination of more than one of, a public, private or hosted network; the intermediate network 920, if any, may be a backbone network or the Internet; in particular, the intermediate network 920 may comprise two or more sub-networks (not shown).

The communication system of FIG. 9 as a whole enables connectivity between the connected UEs 991, 992 and the host computer 930. The connectivity may be described as an over-the-top (OTT) connection 950. The host computer 930 and the connected UEs 991, 992 are configured to communicate data and/or signaling via the OTT connection 950, using the access network 911, the core network 914, any intermediate network 920 and possible further infrastructure (not shown) as intermediaries. The OTT connection 950 may be transparent in the sense that the participating communication devices through which the OTT connection 950 passes are unaware of routing of uplink and downlink communications. For example, the base station 912 may not or need not be informed about the past routing of an incoming downlink communication with data originating from the host computer 930 to be forwarded (e.g., handed over) to a connected UE 991. Similarly, the base station 912 need not be aware of the future routing of an outgoing uplink communication originating from the UE 991 towards the host computer 930.

Figure 10:
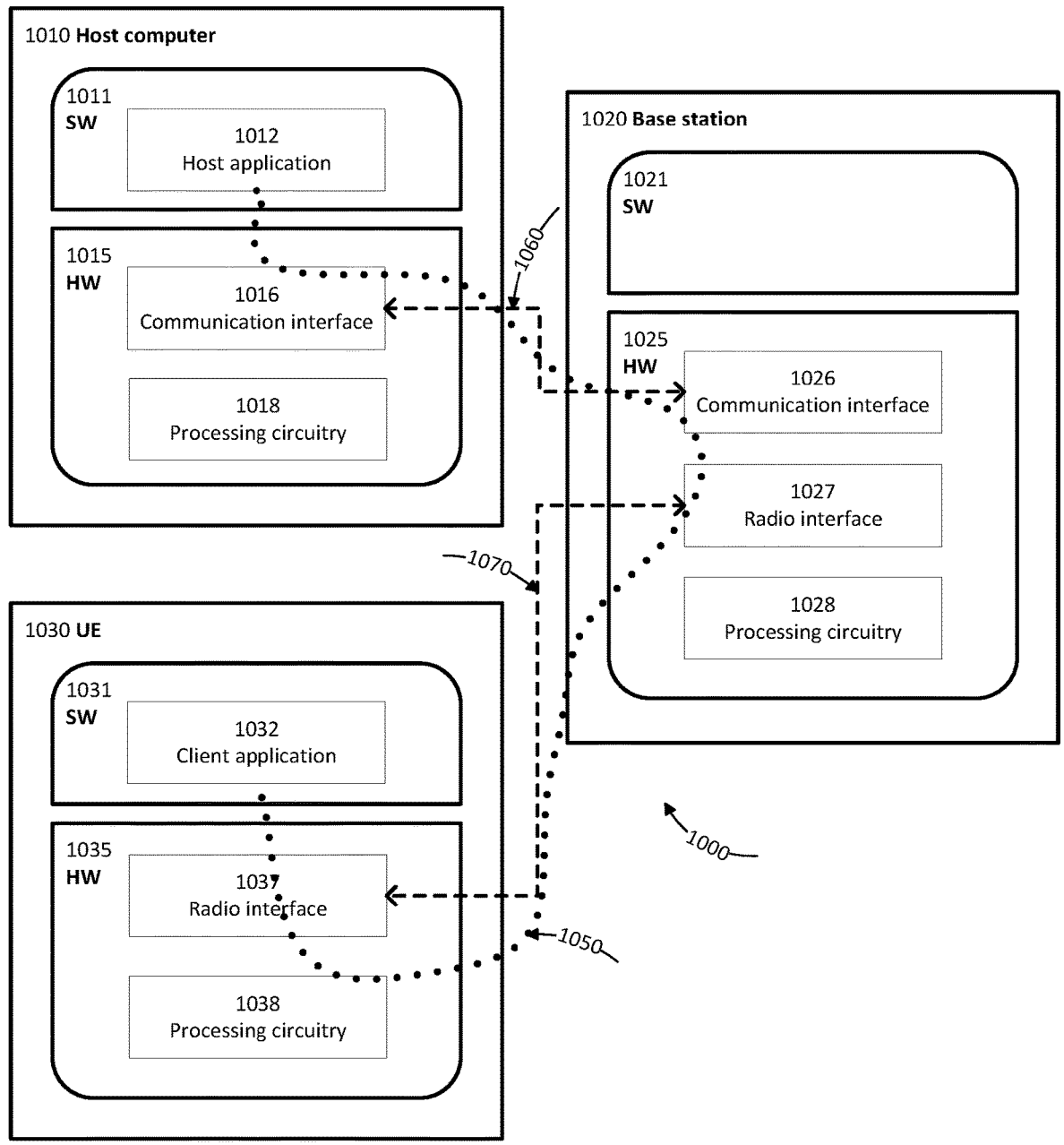
FIG. 10 is a block diagram illustrating a host computer communicating via a base station with a UE over a partially wireless connection in accordance with some embodiments of the present disclosure.

FIG. 10 is a block diagram illustrating a host computer communicating via a base station with a UE over a partially wireless connection in accordance with some embodiments of the present disclosure.

Example implementations, in accordance with an embodiment, of the UE, base station and host computer discussed in the preceding paragraphs will now be described with reference to FIG. 10. In a communication system 1000, a host computer 1010 comprises hardware 1015 including a communication interface 1016 configured to set up and maintain a wired or wireless connection with an interface of a different communication device of the communication system 1000. The host computer 1010 further comprises a processing circuitry 1018, which may have storage and/or processing capabilities. In particular, the processing circuitry 1018 may comprise one or more programmable processors, application-specific integrated circuits, field programmable gate arrays or combinations of these (not shown) adapted to execute instructions. The host computer 1010 further comprises software 1011, which is stored in or accessible by the host computer 1010 and executable by the processing circuitry 1018. The software 1011 includes a host application 1012. The host application 1012 may be operable to provide a service to a remote user, such as UE 1030 connecting via an OTT connection 1050 terminating at the UE 1030 and the host computer 1010. In providing the service to the remote user, the host application 1012 may provide user data which is transmitted using the OTT connection 1050.

The communication system 1000 further includes a base station 1020 provided in a telecommunication system and comprising hardware 1025 enabling it to communicate with the host computer 1010 and with the UE 1030. The hardware 1025 may include a communication interface 1026 for setting up and maintaining a wired or wireless connection with an interface of a different communication device of the communication system 1000, as well as a radio interface 1027 for setting up and maintaining at least a wireless connection 1070 with the UE 1030 located in a coverage area (not shown in FIG. 10) served by the base station 1020. The communication interface 1026 may be configured to facilitate a connection 1060 to the host computer 1010. The connection 1060 may be direct or it may pass through a core network (not shown in FIG. 10) of the telecommunication system and/or through one or more intermediate networks outside the telecommunication system. In the embodiment shown, the hardware 1025 of the base station 1020 further includes a processing circuitry 1028, which may comprise one or more programmable processors, application-specific integrated circuits, field programmable gate arrays or combinations of these (not shown) adapted to execute instructions. The base station 1020 further has software 1021 stored internally or accessible via an external connection.

The communication system 1000 further includes the UE 1030 already referred to. Its hardware 1035 may include a radio interface 1037 configured to set up and maintain a wireless connection 1070 with a base station serving a coverage area in which the UE 1030 is currently located. The hardware 1035 of the UE 1030 further includes a processing circuitry 1038, which may comprise one or more programmable processors, application-specific integrated circuits, field programmable gate arrays or combinations of these (not shown) adapted to execute instructions. The UE 1030 further comprises software 1031, which is stored in or accessible by the UE 1030 and executable by the processing circuitry 1038. The software 1031 includes a client application 1032. The client application 1032 may be operable to provide a service to a human or non-human user via the UE 1030, with the support of the host computer 1010. In the host computer 1010, an executing host application 1012 may communicate with the executing client application 1032 via the OTT connection 1050 terminating at the UE 1030 and the host computer 1010. In providing the service to the user, the client application 1032 may receive request data from the host application 1012 and provide user data in response to the request data. The OTT connection 1050 may transfer both the request data and the user data. The client application 1032 may interact with the user to generate the user data that it provides.

It is noted that the host computer 1010, the base station 1020 and the UE 1030 illustrated in FIG. 10 may be similar or identical to the host computer 930, one of base stations 912a, 912b, 912c and one of UEs 991, 992 of FIG. 9, respectively. This is to say, the inner workings of these entities may be as shown in FIG. 10 and independently, the surrounding network topology may be that of FIG. 9.

In FIG. 10, the OTT connection 1050 has been drawn abstractly to illustrate the communication between the host computer 1010 and the UE 1030 via the base station 1020, without explicit reference to any intermediary devices and the precise routing of messages via these devices. Network infrastructure may determine the routing, which it may be configured to hide from the UE 1030 or from the service provider operating the host computer 1010, or both. While the OTT connection 1050 is active, the network infrastructure may further take decisions by which it dynamically changes the routing (e.g., on the basis of load balancing consideration or reconfiguration of the network).

Wireless connection 1070 between the UE 1030 and the base station 1020 is in accordance with the teachings of the embodiments described throughout this disclosure. One or more of the various embodiments improve the performance of OTT services provided to the UE 1030 using the OTT connection 1050, in which the wireless connection 1070 forms the last segment. More precisely, the teachings of these embodiments may improve the latency and the power consumption, and thereby provide benefits such as lower complexity, reduced time required to access a cell, better responsiveness, extended battery lifetime, etc.

A measurement procedure may be provided for the purpose of monitoring data rate, latency and other factors on which the one or more embodiments improve. There may further be an optional network functionality for reconfiguring the OTT connection 1050 between the host computer 1010 and the UE 1030, in response to variations in the measurement results. The measurement procedure and/or the network functionality for reconfiguring the OTT connection 1050 may be implemented in software 1011 and hardware 1015 of the host computer 1010 or in software 1031 and hardware 1035 of the UE 1030, or both. In embodiments, sensors (not shown) may be deployed in or in association with communication devices through which the OTT connection 1050 passes; the sensors may participate in the measurement procedure by supplying values of the monitored quantities exemplified above, or supplying values of other physical quantities from which the software 1011, 1031 may compute or estimate the monitored quantities. The reconfiguring of the OTT connection 1050 may include message format, retransmission settings, preferred routing etc.; the reconfiguring need not affect the base station 1020, and it may be unknown or imperceptible to the base station 1020. Such procedures and functionalities may be known and practiced in the art. In certain embodiments, measurements may involve proprietary UE signaling facilitating the host computer 1010's measurements of throughput, propagation times, latency and the like. The measurements may be implemented in that the software 1011 and 1031 causes messages to be transmitted, in particular empty or 'dummy' messages, using the OTT connection 1050 while it monitors propagation times, errors etc.

Figure 11:
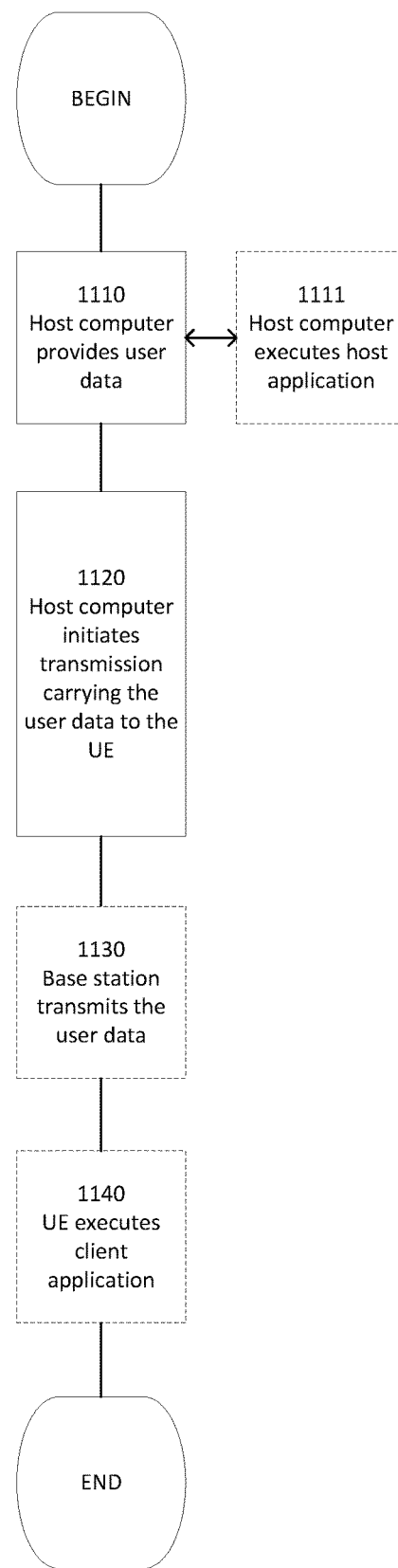
FIG. 11 is a flowchart illustrating a method implemented in a communication system, in accordance with an embodiment of the present disclosure.

FIG. 11 is a flowchart illustrating a method implemented in a communication system, in accordance with an embodiment. The communication system includes a host computer, a base station and a UE which may be those described with reference to FIG. 9 and FIG. 10. For simplicity of the present disclosure, only drawing references to FIG. 11 will be included in this section. In step 1110, the host computer provides user data. In substep 1111 (which may be optional) of step 1110, the host computer provides the user data by executing a host application. In step 1120, the host computer initiates a transmission carrying the user data to the UE. In step 1130 (which may be optional), the base station transmits to the UE the user data which was carried in the transmission that the host computer initiated, in accordance with the teachings of the embodiments described throughout this disclosure. In step 1140 (which may also be optional), the UE executes a client application associated with the host application executed by the host computer.

Figure 12:
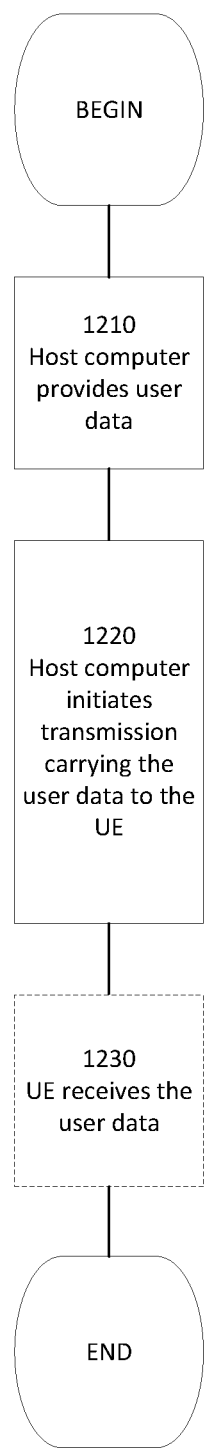
FIG. 12 is a flowchart illustrating a method implemented in a communication system, in accordance with an embodiment of the present disclosure.

FIG. 12 is a flowchart illustrating a method implemented in a communication system, in accordance with an embodiment. The communication system includes a host computer, a base station and a UE which may be those described with reference to FIG. 9 and FIG. 10. For simplicity of the present disclosure, only drawing references to FIG. 12 will be included in this section. In step 1210 of the method, the host computer provides user data. In an optional substep (not shown) the host computer provides the user data by executing a host application. In step 1220, the host computer initiates a transmission carrying the user data to the UE. The transmission may pass via the base station, in accordance with the teachings of the embodiments described throughout this disclosure. In step 1230 (which may be optional), the UE receives the user data carried in the transmission.

Figure 13:
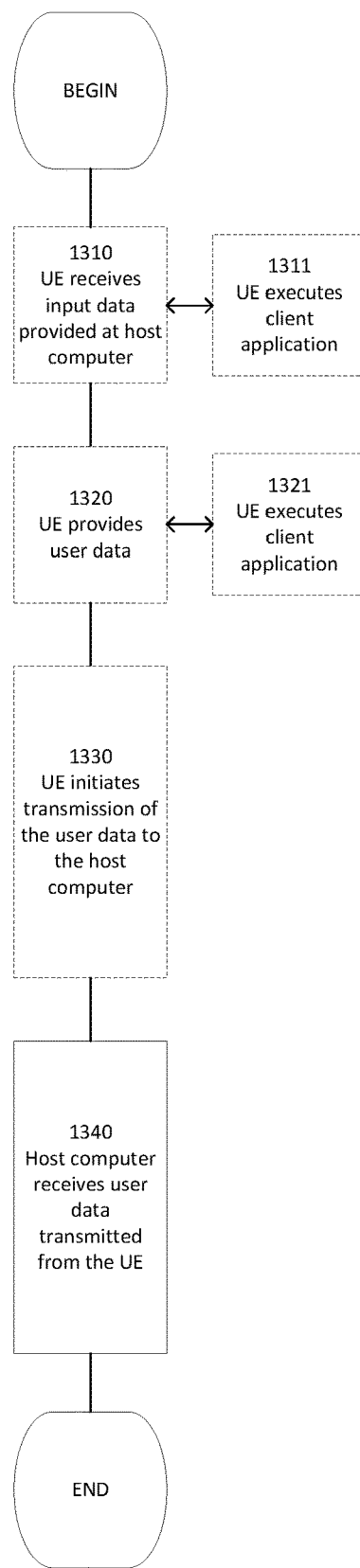
FIG. 13 is a flowchart illustrating a method implemented in a communication system, in accordance with an embodiment of the present disclosure.

FIG. 13 is a flowchart illustrating a method implemented in a communication system, in accordance with an embodiment. The communication system includes a host computer, a base station and a UE which may be those described with reference to FIG. 9 and FIG. 10. For simplicity of the present disclosure, only drawing references to FIG. 13 will be included in this section. In step 1310 (which may be optional), the UE receives input data provided by the host computer. Additionally or alternatively, in step 1320, the UE provides user data. In substep 1321 (which may be optional) of step 1320, the UE provides the user data by executing a client application. In substep 1311 (which may be optional) of step 1310, the UE executes a client application which provides the user data in reaction to the received input data provided by the host computer. In providing the user data, the executed client application may further consider user input received from the user. Regardless of the specific manner in which the user data was provided, the UE initiates, in substep 1330 (which may be optional), transmission of the user data to the host computer. In step 1340 of the method, the host computer receives the user data transmitted from the UE, in accordance with the teachings of the embodiments described throughout this disclosure.

Figure 14:
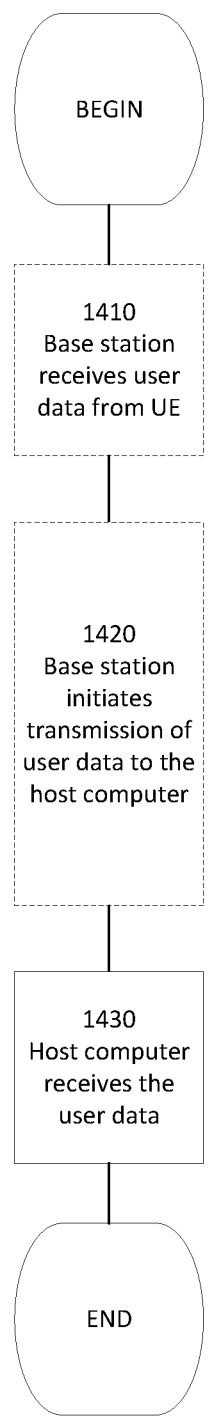
FIG. 14 is a flowchart illustrating a method implemented in a communication system, in accordance with an embodiment of the present disclosure.

FIG. 14 is a flowchart illustrating a method implemented in a communication system, in accordance with an embodiment. The communication system includes a host computer, a base station and a UE which may be those described with reference to FIG. 9 and FIG. 10. For simplicity of the present disclosure, only drawing references to FIG. 14 will be included in this section. In step 1410 (which may be optional), in accordance with the teachings of the embodiments described throughout this disclosure, the base station receives user data from the UE. In step 1420 (which may be optional), the base station initiates transmission of the received user data to the host computer. In step 1430 (which may be optional), the host computer receives the user data carried in the transmission initiated by the base station.

According to some exemplary embodiments, there is provided a method implemented in a communication system which may include a host computer, a base station and a UE. The method may comprise providing user data at the host computer. Optionally, the method may comprise, at the host computer, initiating a transmission carrying the user data to the UE via a cellular network comprising the base station which may perform any step of the exemplary method 600 as describe with respect to FIG. 6.

According to some exemplary embodiments, there is provided a communication system including a host computer. The host computer may comprise processing circuitry configured to provide user data, and a communication interface configured to forward the user data to a cellular network for transmission to a UE. The cellular network may comprise a base station having a radio interface and processing circuitry. The base station's processing circuitry may be configured to perform any step of the exemplary method 600 as describe with respect to FIG. 6.

According to some exemplary embodiments, there is provided a method implemented in a communication system which may include a host computer, a base station and a UE. The method may comprise providing user data at the host computer. Optionally, the method may comprise, at the host computer, initiating a transmission carrying the user data to the UE via a cellular network comprising the base station. The UE may perform any step of the exemplary method 600 as describe with respect to FIG. 6.

According to some exemplary embodiments, there is provided a communication system including a host computer. The host computer may comprise processing circuitry configured to provide user data, and a communication interface configured to forward user data to a cellular network for transmission to a UE. The UE may comprise a radio interface and processing circuitry. The UE's processing circuitry may be configured to perform any step of the exemplary method 600 as describe with respect to FIG. 6.

According to some exemplary embodiments, there is provided a method implemented in a communication system which may include a host computer, a base station and a UE. The method may comprise, at the host computer, receiving user data transmitted to the base station from the UE which may perform any step of the exemplary method 600 as describe with respect to FIG. 6.

According to some exemplary embodiments, there is provided a communication system including a host computer. The host computer may comprise a communication interface configured to receive user data originating from a transmission from a UE to a base station. The UE may comprise a radio interface and processing circuitry. The UE's processing circuitry may be configured to perform any step of the exemplary method 600 as describe with respect to FIG. 6.

According to some exemplary embodiments, there is provided a method implemented in a communication system which may include a host computer, a base station and a UE. The method may comprise, at the host computer, receiving, from the base station, user data originating from a transmission which the base station has received from the UE. The base station may perform any step of the exemplary method 600 as describe with respect to FIG. 6.

According to some exemplary embodiments, there is provided a communication system which may include a host computer. The host computer may comprise a communication interface configured to receive user data originating from a transmission from a UE to a base station. The base station may comprise a radio interface and processing circuitry. The base station's processing circuitry may be configured to perform any step of the exemplary method 600 as describe with respect to FIG. 6.

In general, the various exemplary embodiments may be implemented in hardware or special purpose chips, circuits, software, logic or any combination thereof. For example, some aspects may be implemented in hardware, while other aspects may be implemented in firmware or software which may be executed by a controller, microprocessor or other computing device, although the disclosure is not limited thereto. While various aspects of the exemplary embodiments of this disclosure may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

As such, it should be appreciated that at least some aspects of the exemplary embodiments of the disclosure may be practiced in various components such as integrated circuit chips and modules. It should thus be appreciated that the exemplary embodiments of this disclosure may be realized in an apparatus that is embodied as an integrated circuit, where the integrated circuit may comprise circuitry (as well as possibly firmware) for embodying at least one or more of a data processor, a digital signal processor, baseband circuitry and radio frequency circuitry that are configurable so as to operate in accordance with the exemplary embodiments of this disclosure.

It should be appreciated that at least some aspects of the exemplary embodiments of the disclosure may be embodied in computer-executable instructions, such as in one or more program modules, executed by one or more computers or other devices. Generally, program modules include routines, programs, objects, components, data structures, etc. that perform particular tasks or implement particular abstract data types when executed by a processor in a computer or other device. The computer executable instructions may be stored on a computer readable medium such as a hard disk, optical disk, removable storage media, solid state memory, random access memory (RAM), etc. As will be appreciated by one of skill in the art, the function of the program modules may be combined or distributed as desired in various embodiments. In addition, the function may be embodied in whole or partly in firmware or hardware equivalents such as integrated circuits, field programmable gate arrays (FPGA), and the like.

The present disclosure includes any novel feature or combination of features disclosed herein either explicitly or any generalization thereof. Various modifications and adaptations to the foregoing exemplary embodiments of this disclosure may become apparent to those skilled in the relevant arts in view of the foregoing description, when read in conjunction with the accompanying drawings. However, any and all modifications will still fall within the scope of the non-limiting and exemplary embodiments of this disclosure.

What is claimed is:

1. A method performed by a communication device, comprising:
determining, in response to interference to data on a first subset of multiple antenna branches of the communication device, first correlation information which indicates at least correlation between the data on the first subset of the multiple antenna branches and data on a second subset of the multiple antenna branches which is not affected by interference; and
correcting the data on the first subset of the multiple antenna branches, based at least in part on the first correlation information.

2. The method according to claim 1, wherein the correction of the data on the first subset of the multiple antenna branches based at least in part on the first correlation information comprises:
obtaining the data on the second subset of the multiple antenna branches; and
correcting the data on the first subset of the multiple antenna branches by using the data on the second subset of the multiple antenna branches, based at least in part on the first correlation information.

3. The method according to claim 1, wherein the data on the first subset of the multiple antenna branches is corrected by interpolating the data on the second subset of the multiple antenna branches.

4. The method according to claim 1, wherein the first correlation information is determined according to second correlation information which indicates correlation between data on the multiple antenna branches.

5. The method according to claim 4, wherein the second correlation information is determined by:
collecting the data on the multiple antenna branches at one or more time points; and
calculating correlation of the collected data in at least one of time domain and spatial domain to determine the second correlation information.

6. The method according to claim 5, wherein the one or more time points are within a time period during which the data on the multiple antenna branches is not affected by interference.

7. The method according to claim 4, wherein the second correlation information is updated according to a predefined rule.

8. The method according to claim 1, wherein the interference to the data on the first subset of the multiple antenna branches comprises glitches occurring on the first subset of the multiple antenna branches.

9. The method according to claim 8, wherein the occurrence of the glitches is randomized by asynchronously changing automatic gain control on different antenna branches.

10. The method according to claim 9, wherein the automatic gain control on different antenna branches is asynchronously changed by:
triggering the automatic gain control on different antenna branches according to different trigger levels.

11. The method according to claim 9, wherein the automatic gain control on different antenna branches is asynchronously changed by:
releasing the automatic gain control on different antenna branches at different time points.

12. A communication device, comprising:
one or more processors; and
one or more memories comprising computer program codes, the one or more memories and the computer program codes configured to, with the one or more processors, cause the communication device at least to:
determine, in response to interference to data on a first subset of multiple antenna branches of the communication device, first correlation information which indicates at least correlation between the data on the first subset of the multiple antenna branches and data on a second subset of the multiple antenna branches which is not affected by interference; and correct the data on the first subset of the multiple antenna branches, based at least in part on the first correlation information.

13. The communication device according to claim 12, wherein the correction of the data on the first subset of the multiple antenna branches based at least in part on the first correlation information comprises:

obtaining the data on the second subset of the multiple antenna branches; and correcting the data on the first subset of the multiple antenna branches by using the data on the second subset of the multiple antenna branches, based at least in part on the first correlation information.

14. The communication device according to claim 12, wherein the data on the first subset of the multiple antenna branches is corrected by interpolating the data on the second subset of the multiple antenna branches.

15. The communication device according to claim 12, wherein the first correlation information is determined according to second correlation information which indicates correlation between data on the multiple antenna branches.

16. The communication device according to claim 15, wherein the second correlation information is determined by:

collecting the data on the multiple antenna branches at one or more time points; and calculating correlation of the collected data in at least one of time domain and spatial domain to determine the second correlation information.

17. The communication device according to claim 16, wherein the one or more time points are within a time period during which the data on the multiple antenna branches is not affected by interference.

18. The communication device according to claim 15, wherein the second correlation information is updated according to a predefined rule.

19. The communication device according to claim 12, wherein the interference to the data on the first subset of the multiple antenna branches comprises glitches occurring on the first subset of the multiple antenna branches.

20. The communication device according to claim 19, wherein the occurrence of the glitches is randomized by asynchronously changing automatic gain control on different antenna branches.

* * * * *